United States Patent [19]

Maeda et al.

[11] Patent Number: 5,014,106
[45] Date of Patent: May 7, 1991

[54] SEMICONDUCTOR DEVICE FOR USE IN A HYBRID LSI CIRCUIT

[75] Inventors: Takeo Maeda, Tokyo; Masayoshi Higashizono, Kawasaki, both of Japan

[73] Assignee: Kabushiki Kaisha Toshiba, Kawasaki, Japan

[21] Appl. No.: 489,896

[22] Filed: Mar. 7, 1990

[30] Foreign Application Priority Data

Mar. 14, 1989 [JP] Japan .................................. 1-61638

[51] Int. Cl.$^5$ ............................................ H01L 27/02
[52] U.S. Cl. ........................................ 357/43; 357/64; 357/90
[58] Field of Search ................... 357/43, 42, 44, 90, 357/40, 46, 64

[56] References Cited

U.S. PATENT DOCUMENTS 4,884,117 11/1989 Neppl et al. .................. 357/42 X
4,887,142 12/1989 Bertotti ............................. 357/43

*Primary Examiner*—William Mintel
*Assistant Examiner*—Roy Potter
*Attorney, Agent, or Firm*—Banner, Birch, McKie & Beckett

[57] ABSTRACT

A semiconductor device for use in a hybrid LSI circuit is disclosed which comprises MOSFETs and at least two bipolar transistor—all formed on the same semiconductor substrate. More specifically, p$^+$-type buried diffusion layers and p$^+$-type buried diffusion layers are formed on a P-type semiconductor substrate. An N-type epitaxial layer is formed on these buried layers. N-type well-regions and a P-type well-region are formed in the selected portions of the N-type epitaxial layer. A P-channel MOSFET and an N-channel MOSFET are formed in the N-type well-region and the P-type well-region, respectively. A first bipolar transistor is formed on the N-type epitaxial layer. A second bipolar transistor is formed on the N-type well-region which has an impurity concentration higher than that of the N-type epitaxial layer.

24 Claims, 5 Drawing Sheets

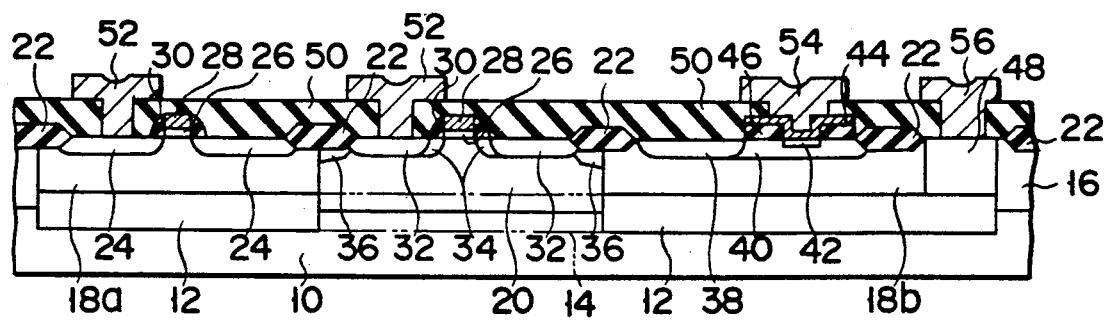
F I G. 1
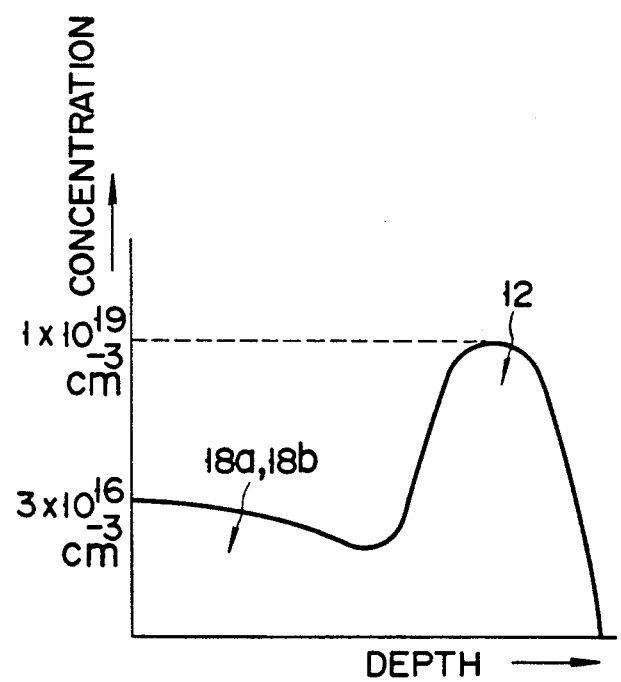
F I G. 2
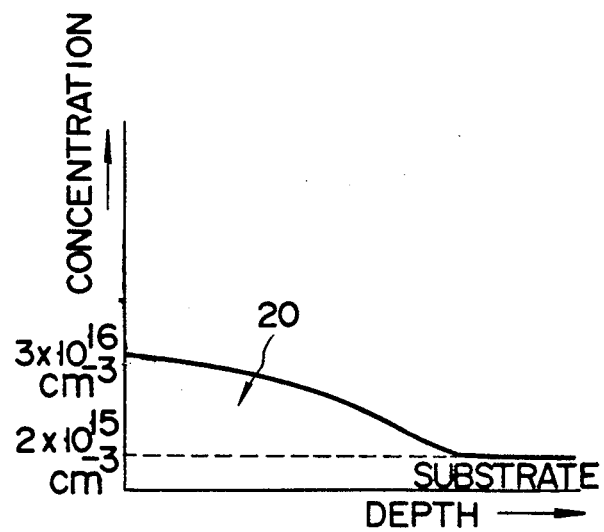
F I G. 3

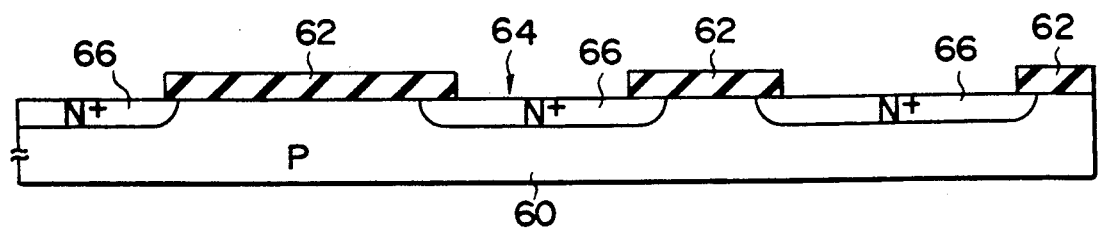
F I G. 4A
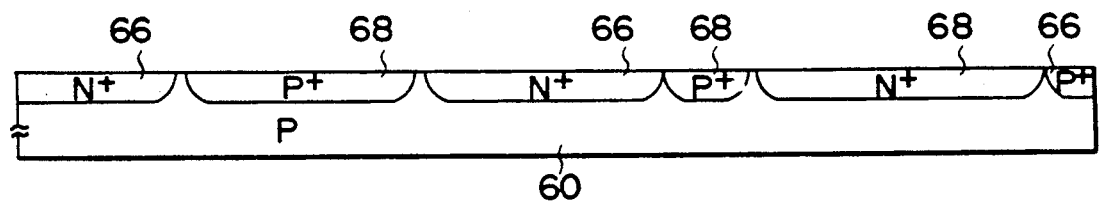
F I G. 4B
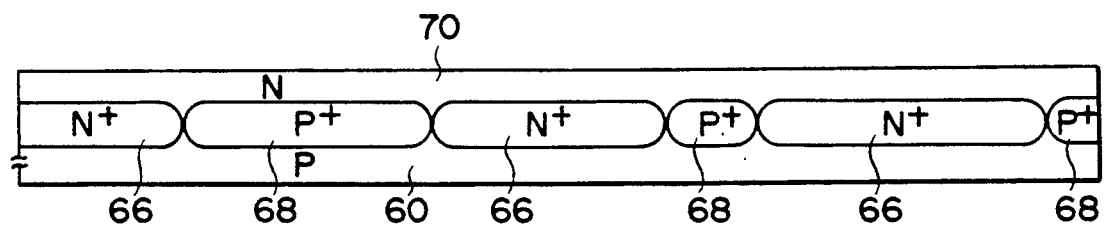
F I G. 4C
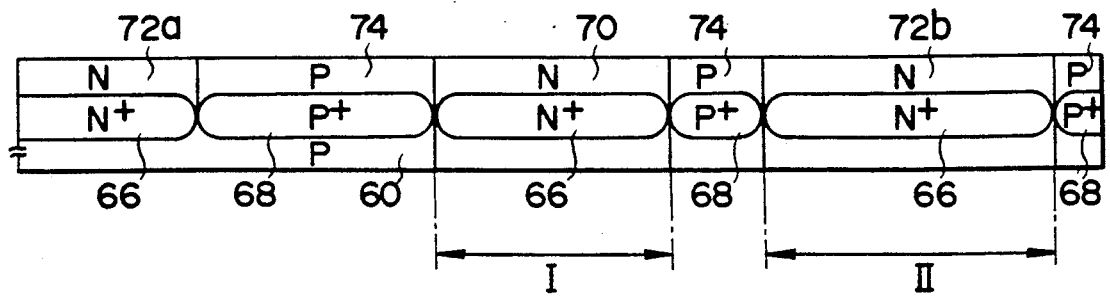
F I G. 4D

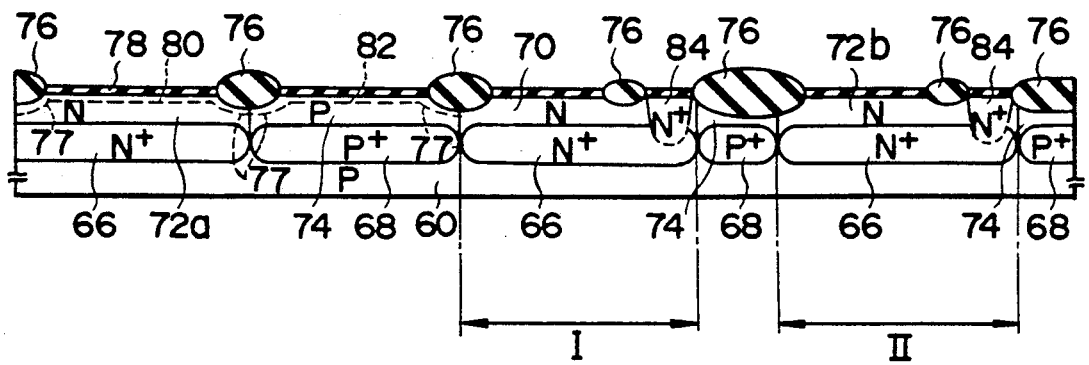
F I G. 4E
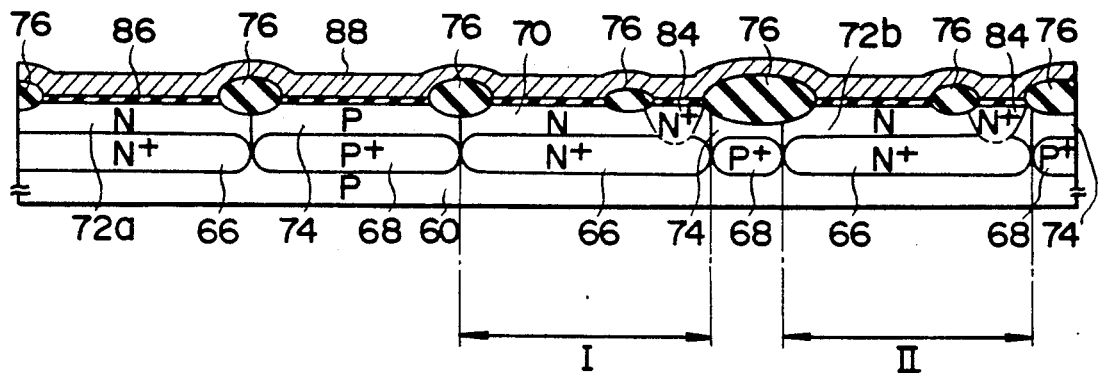
F I G. 4F
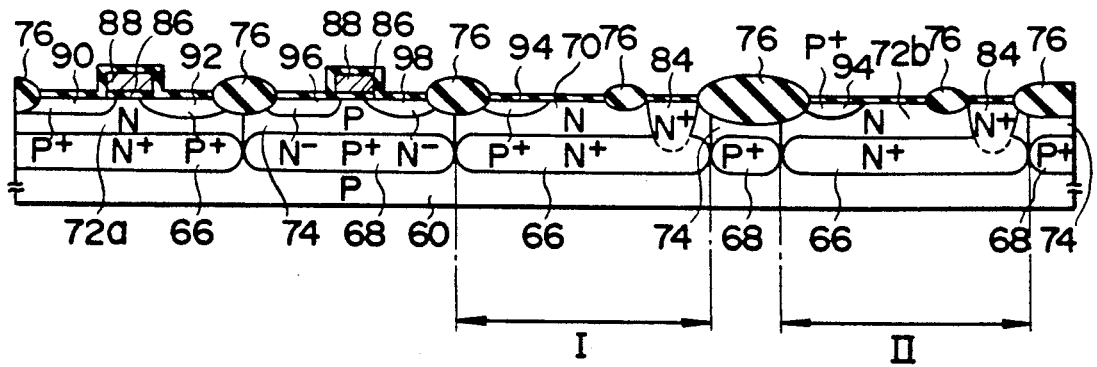
F I G. 4G ic of the bipolar transistor is improved in proportion to the cutoff frequency $f_T$. How-

SEMICONDUCTOR DEVICE FOR USE IN A HYBRID LSI CIRCUIT

BACKGROUND OF THE INVENTION

1. Field of the Invention

The present invention relates to a semiconductor device which is designed for use in a a hybrid LSI (Large-Scale Integrated) circuit, and which comprises bipolar transistors and a MOSFET, and more particularly a semiconductor device which comprises bipolar transistors and a MOSFET whose characteristic remains unchanged, and which is therefore greatly resistant to soft errors.

2. Description of the Related Art

Semiconductor devices have been used, each of which can be used for constituting a hybrid LSI (Large-Scale Integrated) circuit and comprises bipolar transistors and MOSFETs.

FIG. 1 is a sectional view illustrating a conventional semiconductor device for use in a hybrid LSI circuit. This device which comprises a bipolar transistor and two MOSFETs. As this figure shows, a $N^{30}$-type buried layer 12 and a $P^{30}$-type buried diffusion layer 14, both having a high impurity concentration, are formed in a P-type silicon substrate 10. A P-type epitaxial layer 16 is also formed on the P-type silicon substrate 10. N-type well-regions 18a and 18b are formed in those portions of the P-type epitaxial layer 16 which are located on the $N^{30}$-type buried layer 12. The first P-channel MOSFET and the bipolar transistor are formed in the N-type well-regions 18a and 18b, respectively. A P-type well-region 20 is formed in that portion of the P-type epitaxial layer 16 which is located on the $P^{30}$-type buried layer 14 and in which a field oxide film 22 is formed. The field oxide film 22 functions as a element-isolating region.

P-type source/drain regions 24 are formed in the N-type well-region 18a in which the P-channel MOSFET is formed. That portion of the N-type well-region 18a, which is located between the P-type source/drain regions 24, is a channel region. A gate-oxide film 26 is formed on this channel region, and a gate electrode 28 is formed on the gate-oxide film 26. An insulating film 30 is formed on the sides of the gate-oxide film 26 and the gate electrode 28, and is used as a side-wall spacer.

N-type source/drain regions 32 are formed in the P-type well-region 20 in which the second N-channel MOSFET is formed. The second N-channel MOSFET is of the so-called LDD structure, and its source an drain have a high breakdown voltage. Thus, as is evident from FIG. 1, $N^-$-type source/drain regions 34 having a low impurity concentration are formed in contact with the N-type source/drain regions 32, respectively. That portion of the P-type well-region 20 which is located between the $N^-$-type source/drain regions 34 is a channel region. A gate-oxide film 26 is formed on this channel region, and a gate electrode 28 is formed on the gate-oxide film 26. An insulating film 30 is formed on the sides of the gate-oxide film 26 and the gate electrode 28, and is used as a side-wall spacer. Also, a $P^-$- type inversion-preventing layer 36 having a low impurity concentration is formed below the field oxide film 22 formed in the surface of the P-type well-region 20.

The N-type well-region 18b, in which the bipolar transistor is formed, functions as the collector of this bipolar transistor. A $P^{30}$-type external base region 38, which has a high impurity concentration, is formed in the N-type well-region 18b. A P-type internal base region 40 is formed also in the N-type well-region 18b. The region 40 contacts with the $P^{30}$-type external base region 38. An N-type emitter region 42 is formed in a part of the P-type internal base region 40. An emitter electrode 44 made of polysilicon is formed on the N-type emitter region 42. As is shown in FIG. 1, an insulating film 46 electrically isolates the emitter electrode 44 from the P-type internal base region 40. Also, an $N^{30}$-type external collector region 48 is formed on one portion of the $N^{30}$-type buried layer 12, in contact therewith.

An inter-layer insulating film 50 is formed on the entire surface of the P-type epitaxial layer 16, including the element-forming regions in which the bipolar transistor, the P-channel MOSFET and the N-type MOSFET. Source/drain electrodes 52, both made of aluminum, are formed on those portions of the film 50 which are located on the P-type source/drain region 24 of the P-channel MOSFET and the N-type source/drain region 32 of the N-channel MOSFET. These electrodes 52 extend through contact holes made in the inter-layer insulating film 50 and are electrically connected to the source/drain regions 24 and 32, respectively. An emitter electrode 54, also made of aluminum, is formed on that portion of the film 50 which is located on the emitter 44 of the bipolar transistor. This electrode 54 extends through a contact hole made in the film 50 and is electrically connected to the emitter 44. A collector electrode 56, also made of aluminum, is formed on that portion of the film 50 which is located on the $N^{30}$-type external collector region 48. The collector electrode 56 extends through a contact hole cut in the film 50 and is electrically connected to the external collector region 48.

The conventional semiconductor device described above has an N-type well-regions 18a and 18b in the P-type epitaxial layer 16, so that a P-channel MOSFET and a bipolar transistor are formed in these N-type well-regions 18a and 18b, respectively. To simplify the process of manufacturing the semiconductor device, those portions of the layer 16 which correspond to the well-regions 18a and 18b simultaneously undergo impurity-ion injection, and also simultaneously undergo impurity diffusion.

FIG. 2 is graph which represents the impurity-concentration profile of the N-type well-regions 18a and 18b of the prior-art semiconductor device, in which the P-channel MOSFET and the bipolar transistor are formed, respectively. As can be clearly understood from the graph of FIG. 2, the N-type regions 18a and 18b have an identical impurity-concentration profile. The well-region 18a, which the P-channel MOSFET is formed, has a impurity concentration high enough to suppress the so-called "short-channel effect" resulting from the micro-processing of the P-channel MOSFET. Since the well-region 18b is formed along with the well-region 18a, in the same step, it also has a high impurity concentration. Hence, the collector of the bipolar transistor, which is formed in the well-region 18b, also has a high impurity concentration.

The higher the impurity concentration of the collector of the bipolar transistor, the higher the cutoff frequency $f_T$ of the bipolar transistor, which is a fundamental property of a bipolar transistor. Thus, the high-frequency characteristic of the bipolar transistor is improved in proportion to the cutoff frequency $f_T$. However, the higher the impurity concentration of the collector, the lower the base-collector breakdown voltage $BV_{CBO}$ and the early voltage $V_{AF}$ of the bipolar transistor. In other words, the breakdown voltage of the bipolar transistor decreases in inverse proportion to the cutoff frequency $f_T$. So do the amplification factor and linear characteristic of the bipolar transistor.

As has been described, the N-type well-regions 18a and 18b are formed by diffusing an N-type impurity into the P-type epitaxial layer 16. When the P-type epitaxial layer 16 is heated at high temperature for a long time to impart a sufficiently high impurity concentration to, particularly, the well-region 18a, the impurity concentration of the $P^{30}$-type buried diffusion layer 14 inevitably decreases. Consequently, the buried diffusion layer 14 cannot completely prevent a punch-through between the N-type well-regions 18a and 18b.

FIG. 3 is a graph representing the impurity-concentration profile of the P-type well-region 20 in which the N-channel MOSFET is formed. As is evident from this figure, the concentration of the P-type impurity in the $P^{30}$-type buried diffusion layer 14 decreases toward the substrate 10. This is because the P-type impurity diffuses from the layer 14 into the P-type well-region 20 which is located on the layer 14 and has a impurity concentration lower than that of the buried layer 14. As a result, the impurity concentration of the P-type well-region 20 increases in excess, inevitably altering the characteristic of the N-channel MOSFET formed in the P-type well-region 20.

When a number of semiconductor devices identical to the device described above are used, together with other components, thus constituting a memory LSI, the impurity concentration of each $P^{30}$-type buried layer 14 will becomes almost the same as that of the P-type silicon substrate 10. This implies that the memory LSI is likely to have soft errors due to the α-rays generated by the fission of uranium contained, in a very small amount, in the package material of the memory LSI.

SUMMARY OF THE INVENTION

Accordingly it is an object of the present invention to provide a semiconductor device which is designed for use in a hybrid LSI circuit and which comprises bipolar transistors and a MOSFET, and more particularly a semiconductor device which comprises bipolar transistors having a high cutoff frequency, and a high base-collector breakdown voltage and high early voltage, and a MOSFET formed on the same substrate as the bipolar transistor and having characteristics remaining unchanged despite of the impurity diffusion from a punchthrough preventing $P^{30}$-type buried layer, and which is therefore is greatly resistant to soft errors.

According to an aspect of the present invention, there is provided a semiconductor device for use in a hybrid LSI circuit, said device comprising: a semiconductor substrate of a first conductivity type; a MOSFET having a buried layer of a specified conductivity type formed on the semiconductor substrate, a well-region of the same conductivity type as the buried layer and formed in the buried layer, a current path having two ends, and a control electrode; and at least two bipolar transistors formed on said semiconductor substrate, located near said MOSFET, having a base, a collector, and an emitter each, and each comprising a buried layer of a second conductivity type, a well-region of the second conductivity type formed on the buried layer of the second conductivity type, and an epitaxial layer of the second conductivity type formed on the buried layer of the second conductivity type, the collectors of said bipolar transistors having different impurity concentration.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a sectional view showing a conventional semiconductor device designed for use in a hybrid LSI circuit and comprising one bipolar transistor and two MOSFETs;

FIG. 2 is a graph representing the impurity-concentration profile of the N-type well-regions of the device shown in FIG. 1, in which the bipolar transistor and the first MOSFET are formed, respectively;

FIG. 3 is a graph representing the impurity-concentration profile of the P-type well-region of the device shown in FIG. 1, in which the second MOSFET is formed;

FIGS. 4A through 4J are cross-sectional views, explaining how a semiconductor device according to an embodiment of the invention is manufactured which has at least two MOSFETs and at least two bipolar transistors;

DETAILED DESCRIPTION OF THE PREFERRED EMBODIMENTS

Figure 4H:
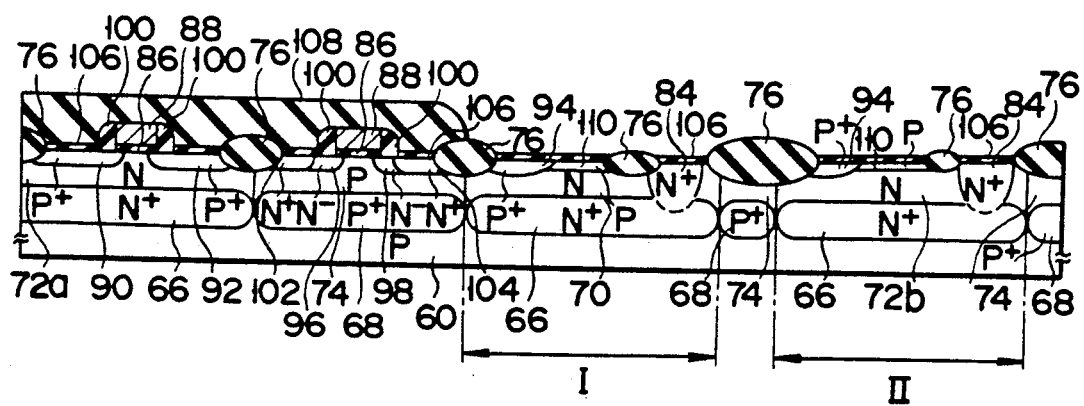

A semiconductor device according to an embodiment of the present invention will now be described, with reference to the accompanying drawings. The semiconductor device is designed for use in a hybrid LSI circuit and comprises bipolar transistors and MOSFETs. With reference to FIGS. 4A to 4J, it will be explained how the semiconductor device according to the invention is manufactured.

First, as is shown in FIG. 4A, an oxide film 62 is formed on a P-type silicon substrate 60 having a crystal axis (100), by means of thermal oxidation. Then, the selected portions of the oxide film 62 are removed from the substrate 60 by means photolithography using photoresist (hereinafter referred to as "photolithography"). The portions of the oxide film 62, remaining on the substrate 60, are patterned, thus forming a patterned oxide film having openings 64. An N-type impurity such as antimony (Sb) is diffused in vapor phase into the substrate 60 through the openings 64 of the patterned oxide film, thereby forming $N^{30}$-type buried layers 66 in the upper surface of the substrate 60. Alternatively, antimony or arsenic (As), which is also an N-type impurity, is either ion-injected or diffused into the substrate 60 through the openings 64 of the patterned oxide film, thus forming $N^{30}$-type buried layers 66. The $N^{30}$-type buried layers 66 function as the collectors of the bipolar transistors.

Next, as is shown in FIG. 4B, the oxide film 62 (i.e., the pattern oxide film) is removed from the P-type silicon substrate 60. Thereafter, photoresist (not shown) is coated on the entire surface of the substrate 60, thus forming a photoresist layer. The photoresist layer is patterned by means of photolithography, thus forming a patterned layer having openings. A P-type impurity such as boron (B) is ion-injected and diffused at the acceleration voltage of 100 KeV and the dose of $1.5 \times 10^{13}$ cm$^{-2}$, into the substrate 60 through the openings of the patterned photoresist layer. As a result of this, $P^{30}$-type buried diffusion layers 68 are formed in the upper surface of the P-type silicon substrate 60. Then, the patterned photoresist layer is removed from the silicon substrate 60.

Then, as is illustrated in FIG. 4C, an N-type epitaxial layer 70 is formed by CVD (chemical vapor deposition) method on the entire upper surface of the substrate 60, in which the buried diffusions layers 66 and 68 have been formed. More specifically, the N-type epitaxial layer 70 grows at, for example, 1130° C. The epitaxial layer 70 has a thickness of 1.2 μm and contains an N-type impurity such as phosphorus (P) in the concentration of about $1 \times 10^{16}$ cm$^{-3}$.

As is illustrated in FIG. 4D, photoresist (not shown) is coated on the entire upper surface of the silicon substrate 60, forming a photoresist layer. The photoresist layer is patterned, thereby forming a patterned photoresist layer which has openings. An N-type impurity such as phosphorus is ion-injected into the substrate 60 through the openings of the patterned photoresist layer, at the acceleration voltage of 160 KeV and the dose of $5 \times 10^{12}$ cm$^{-2}$. An N-type well-regions 72a and 72b are thereby formed in the N-type epitaxial layer 70. A P-channel MOSFET and a bipolar transistor will be formed in the N-type well-regions 72a and 72b, respectively, as will be described later. Then, the patterned photoresist layer is removed from the silicon substrate 60. That portion of the epitaxial layer 70, which indicated by line I, will be referred to as "first bipolar-transistor region," and the N-type well-region 72b, which is indicated by line II, will be called "a second bipolar-transistor region."

Further, photoresist (not shown) is coated on the entire upper surface of the substrate 60, thereby forming a photoresist layer. This photoresist layer is patterned by photolithography, into a pattern photoresist layer which has openings. A P-type impurity, such as boron, is ion-injected and diffused into the silicon substrate 60 through the openings of the patterned photoresist layer at acceleration voltage of 100 KeV and the dose of $6 \times 10^{12}$ cm$^{-2}$. As a result of this, P-type well-regions 74 are formed in the surface of the substrate 60. Two N-channel MOSFETs will be formed in the P-type well-regions 74. Then, the photoresist layer is removed from the substrate 60.

In the step described with reference to FIG. 4D, the P-type well-regions 74 can be formed before the N-type well-regions 72a and 72b. If this is the case, no heat treatment must be performed at 1050° C. or more for ten minutes or longer once after the P-type well-regions 74 have been formed. Otherwise, the impurity will diffuse from the $P^{30}$-type buried layers 68 into the P-type well-regions 74.

Thereafter, as is shown in FIG. 4E, a field oxide film 76 is formed on the N-type epitaxial silicon layer 70 which is formed on the substrate 60 and in which there are formed the N-type well-regions 72a and 72b and the P-type well-regions 74. The field oxide film 76 is formed by, for example, selective oxidation, and has a thickness of about 6000 Å; it functions as an element-isolating region. Before the field oxide film 76 is formed, an impurity had ion-injected into substantially the whole surface region of the epitaxial layer 70. Hence, during the selection oxidation, the surface region of the layer 70, inversion-preventing layers 77 are formed on the N-type well-regions 72a and 72b and also on P-type well-region 74.

Next, dummy gate oxide films 78 having a thickness of 150 Å are formed on the well-regions 72a, 72b and 74, each being in an element-forming region isolated by the field oxide film 76. An impurity is ion-injected through the dummy gate oxide films 78 into the N-type well-region 72a and the P-type well-region 74, whereby channel ion-injected regions 80 and 82 are formed. These regions 80 and 82 serve to matching the threshold voltages of the MOSFETs to be formed, and also to prevent punch-through of these MOSFETs.

Of the channel ion-injected regions 80 and 82, the region 80 is formed by effecting ion-injection twice. First, ions of boron, which is a P-type impurity, is injected into the N-type well-region 72a at the acceleration voltage of 20 KeV and the dose of $3 \times 10^{12}$ cm$^{-2}$. Then, ions of phosphorus, which is an N-type impurity, are injected into the P-type well-region 74 at the acceleration voltage of 240 KeV and the dose of $2 \times 10^{12}$ cm$^{-2}$. On the other hand, the channel ion-injected region 82 is formed by carrying out ion-injection only once. That is, ions of boron, which is a P-type impurity, are injected into the N-type well-region 74 at the acceleration voltage of 20 KeV and the dose of $4 \times 10^{12}$ cm$^{-2}$.

Then, phosphorus, i.e., a P-type impurity, is ion-injected and diffused into the N-type epitaxial layer 70 and the N-type well-region 72b through the dummy oxide films 78, at the acceleration voltage 320 KeV and the dose of $1 \times 10^{16}$ cm$^{-2}$. As a result of this, an $N^{30}$-type external collector region 84 is formed which contacts the $N^{30}$-type buried layer 66.

Next, as is shown in FIG. 4F, the dummy gate oxide films 78 are removed from the well-regions 72a, 72b, and 74. Then, a gate oxide film 86 having a thickness of 150 Å is formed by, for example, thermal oxidation, on the element-forming regions which are isolated by the field oxide films 76. Further, a polysilicon layer 88 having a predetermined thickness is formed by, for example, the CVD method, on the surface of the field oxide films 76 and the gate oxide film 86. A phosphorus are diffused into the polysilicon layer 88, thereby imparting low resistivity to the polysilicon layer 88.

As is illustrated in FIG. 4G, the polysilicon layer 88 is patterned by means of photolithography, such that two portions of the layer 88 remain on those portion of the gate oxide film 86 which are located on the N-type well-region 72a and the P-type well-region 74, respectively. (Hereinafter, the two remaining portions of the layer 88 will be called "gate electrodes 88.") Then, the gate oxide film 86 is patterned, also by photolithography, such that two portions remain on the N-type well-region 72a and the P-type well-region 74. The portion of the film 86 remaining on the N-type well-region 72a and the gate electrode 88 remaining on this portion of the film 86 constitute the gate electrode of the first MOSFET. Similarly, the portion of the film 86 remaining on the P-type well-region 74 and the gate electrode 88 which remains on this portion of the film 86 constitute the gate electrode of the second MOSFET. Next, photoresist (not shown) is coated on the entire upper surface of the structure, forming a photoresist layer. Photolithography is performed on this layer, thus making openings in the layer. These holes are located above those portions of the N-type well-region 72a, the N-type epitaxial layer 70, and the N-type well-region 72b, in which bases will be formed. A P-type impurity such as boron fluoride ($BF_2$) is ion-injected and diffused at the acceleration voltage of 50 KeV and the dose of $5 \times 10^{15}$ cm$^{-2}$ through the openings of the photoresist layer (not shown) into the N-type well-region 72a, the N-type epitaxial layer 70, and the N-type well region 72b. As a result of this, a $P^{30}$-type source region 90, a $P^{30}$-type drain region 92, and a $P^{30}$-type external base region 94 are formed in the N-type well-region 72a, the N-type epitaxial layer 70, and the N-type well-region 72b, respectively.

The boron fluoride ($BF_2$) ion-injected though that opening of the photoresist layer which is located above the N-type well-region 72a is introduced into the N-type well-region 72a through the the gate electrode 88 and the field oxide film 76. At this stage, the gate electrode 88 and the film 76 function as masks. Then, photoresist (not shown) is coated on the entire upper surface of the structure, forming a photoresist layer. Photolithography is effected on this photoresist layer, thereby making two opening located substantially above the P-type well-region 74. Phosphorus, which is an N-type impurity, is ion-injected and diffused at the acceleration voltage of 60 KeV and the dose of $4 \times 10^{13}$ cm$^{-2}$, through these openings into the P-type well-region 74. As a result of this, an N$^-$- type source region 96 and an N$^-$- type drain regions 96 are formed in the P-type well-region 74. The gate electrode 88, the N$^-$- type source region 96, and the N$^-$- type drain regions 96 constitute the N-channel MOSFET. This N-channel MOSFET is of LDD structure since both the source region 96 and the drain region 98 have a low impurity concentration. At this stage, too, the gate electrode 88 and the film 76 are used as masks for ion-injecting phosphorus.

Next, an oxide film 100 having a thickness of about 2000 Å is formed on the entire upper surface of the structure by means of, for example, the CVD method. As is shown in FIG. 4H, the oxide film 100 is subjected to anisotropic etching such as RIE (Reaction Ion Etching), whereby the film 100 remains only on the sides of the gate electrodes 88. The remaining portions of the film 100 will serve as side-wall spacers when the N-channel MOSFET of the LDD structure is formed. Further, photoresist (not shown) is coated on the entire upper surface of the structure, forming a photoresist layer. Photolithography is carried out on the photoresist layer, thereby making openings in the photoresist layer. Arsenic (As), which is an N-type impurity, is ion-injected and thermally diffused at the acceleration voltage of 50 KeV and the dose of $5 \times 10^{15}$ cm$^{-2}$, through these openings of the photoresist layer into the N$^-$- type source region 96 and the N$^-$- type drain region 98, thereby forming and N$^{30}$-type source region 102 and an N$^{30}$-type drain region 104. Hence, the resultant N-channel MOSFET has the LDD structure, as has been described.

The gate electrode 88, the side-wall spacer 100, and the field oxide film 76 function as a mask for ion-injecting arsenic ion-injected into the source region 96 and the drain region 98. The photoresist layer (not shown) is removed from the structure, and the entire structure is heated at 900° C. for 30 minutes in an oxygen atmosphere, whereby an oxide film 106 is formed on the upper surface of the structure. Next, photoresist (not shown) is coated on the entire upper surface of the structure, thus forming a photoresist layer. Photolithography is performed on the photoresist layer, thereby making openings located above the N-type epitaxial layer 70 and the N-type well-region 72b. Boron fluoride ($BF_2$), which is a P-type impurity, is ion-injected and diffused at the acceleration voltage of 30 KeV and the dose of $5 \times 10^{13}$ cm$^{-2}$, through these openings of the photoresist layer into the N-type epitaxial layer 70 and the N-type well-region 72b. As a result of this, P-type internal base regions 110 of the bipolar transistors are formed in the layer 70 and the region 72b, respectively.

Figure 4I:
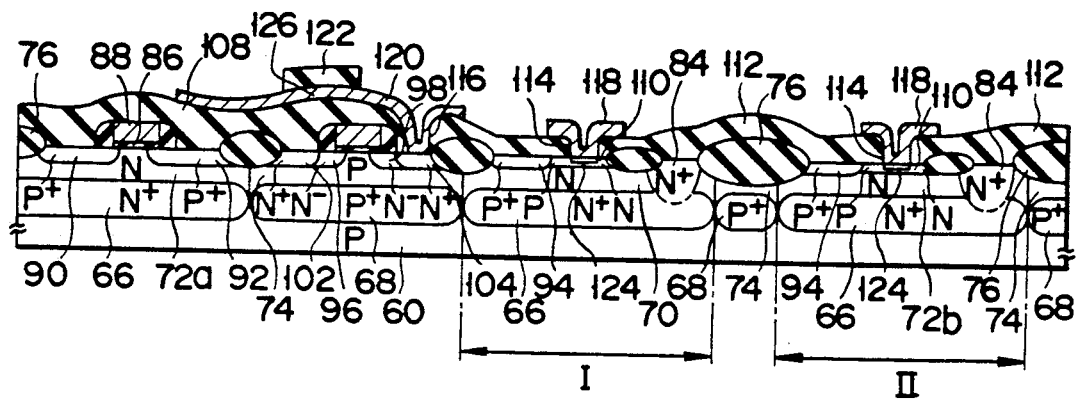

Thereafter, as is shown in FIG. 4I, the photoresist layer 108 is removed from the structure. Then, a CVD oxide film 112 is formed on the entire upper surface of the structure. The CVD oxide film 112 is an inter-layer insulating film. Two contact holes 114 and one contact hole 116 are made in the CVD oxide film 112 by means of, for example, photolithography. A polysilicon layer is formed by the CVD method on the entire upper surface of the structure, also filling up the contact holes 114 and 116 of the oxide film 112. The polysilicon layer is patterned by, for example, photolithography, and is removed except for two portions 118 and another portion 120. Arsenic (As), which is an N-type impurity, is ion-injected at the acceleration voltage of 50 KeV and the dose of $5 \times 10^{15}$ cm$^{-2}$ into the polysilicon layers 118 and 120, using the remaining portions 122 of the photoresist layer. As a result of this, the resistivity of the polysilicon layers 118 is reduced, and two N$^{30}$-type emitter regions 124 are formed within the P-type internal base regions 110, respectively. At the same time, the resistivity of a portion of either polysilicon layer 120 is reduced, thus forming the drain wiring and high-resistance element 126 of the N-channel MOSFET.

Figure 4J:
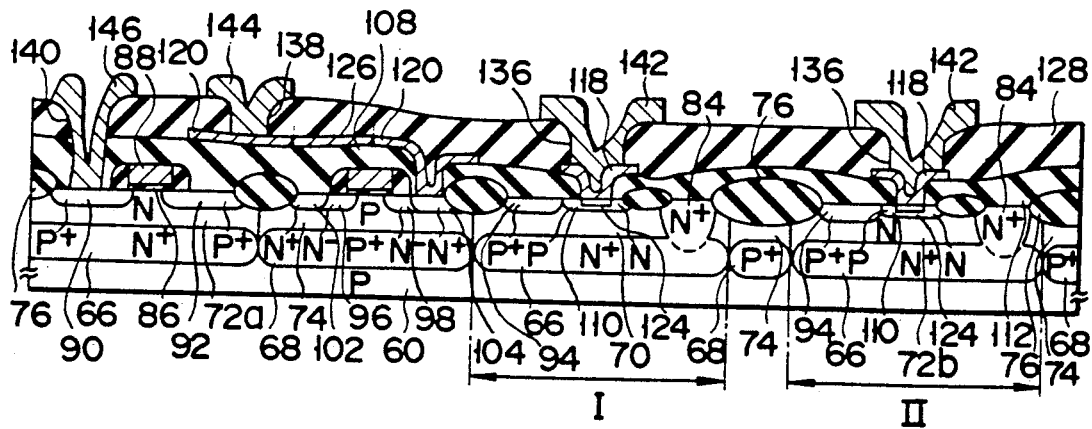

Then, the structure is subjected heat treatment known as "rapid annealing" at 900° to 1050° C. for 5 to 60 seconds, whereby the structure has good contact characteristic. After the rapid annealing, as is shown in FIG. 4J, an inter-layer insulating film 128, which consists of a CVD oxide film and a BPSG film, is formed on the entire upper surface of the structure by means of, for example, the CVD method. Next, this inter-layer insulating film 128 is subjected to re-flow process, thus rendering the surface of the structure sufficiently flat. Two contact holes 136 are made in the film 128, thus exposing the polysilicon layers 118 which serve as the emitter electrodes of the bipolar transistors. Also, a contact hole 138 is made in the film 128, exposing the polysilicon layer 120 which serves as a wiring. Further, a contact hole 140 is formed in the inter-layer insulating film 128, thus exposing the P$^{30}$-type source region 90 which is the source of the P-channel MOSFET.

After the contact holes 136, 138, and 140 have been formed in the inter-layer insulating film 128, an aluminum film for wiring is formed on the entire upper surface of the structure by means of, for example, vacuum vapor deposition. The aluminum film, thus formed, is patterned by, for instance, photolithography, thus forming two aluminum wires 142, and also two other aluminum wires 144 and 146. Thereafter, a surface protection film (not shown) or the like is formed on the entire upper surface of the structure. Thus the semiconductor device is manufactured.

It should be noted that the high-resistance element 126 formed in a portion of the polysilicon layer 120 can be used as the load resistor of, for example, a static memory cell.

In the embodiment described above, the N-channel MOSFET has the LDD structure, whereas the P-channel MOSFET has the ordinary structure. Needless to say, either MOSFET can be of any other structure optimum for its size.

The impurity profile of the region in which the P-channel MOSFET and the second bipolar transistor are formed, that of the region in which the first bipolar transistor is formed, and that of the region in which the N-channel MOSFET is formed will now be explained, with reference to FIGS. 5, 6, and 7.

Figure 5:
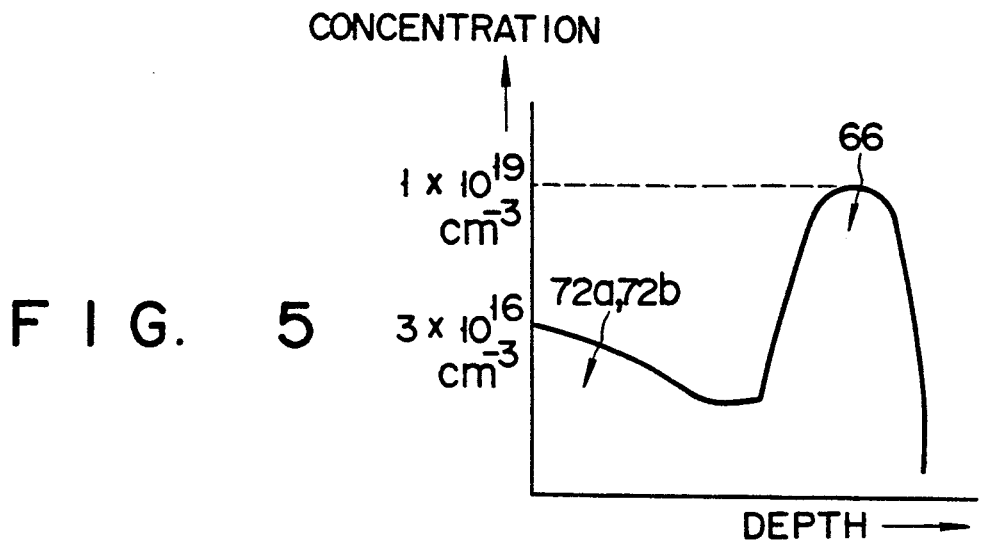
FIG. 5 is a graph representing the impurity-concentration profile of those N-type well-regions of the device shown in FIG. 4J, in which a P-channel MOSFET and a bipolar transistor are formed.

FIG. 5 is a graph representing the impurity concentration profile common to the N-type well-regions 72a and 72b and the $N^{30}$-type buried layer 66, in which the P-channel MOSFET and the second bipolar transistor are formed. As is evident from this figure, the layer 66, which is formed deep within the semiconductor device, has a impurity concentration as high as $1 \times 10^{19}$ cm$^{-3}$. The N-type well-regions 72a and 72b has an impurity concentration of about $3 \times 10^{16}$ cm$^{-3}$ at their surfaces, but their impurity concentration gradually decreases toward to the bottoms and is equal to that of the N-type epitaxial layer 70 at the portions which contact the $N^{30}$-type buried layer 66. In other words, the impurity profile of the N-type well-regions 72a and 72b inclines. Hence, when the second bipolar has a current amplification factor $h_{FE}$ of 100, its collector-base breakdown voltage $BV_{CBO}$ will be 15V, its emitter-collector breakdown voltage $BV_{CEO}$ will be 5V, its early voltage $V_{AF}$ will be 10V, and its maximum cutoff frequency $f_{TMAX}$ will be 15GHz. Obviously, the maximum cutoff frequency $f_{TMAX}$ is high enough to impart excellent high-frequency characteristic to the the second bipolar transistor. In addition, the short-channel effect is sufficiently suppressed in the P-channel MOSFE since the N-type well-region 72a has a high impurity concentration. Further, with this structure, a minimum gate length of the MOSFET can be reduced to 0.7 μm or less.

Figure 6:
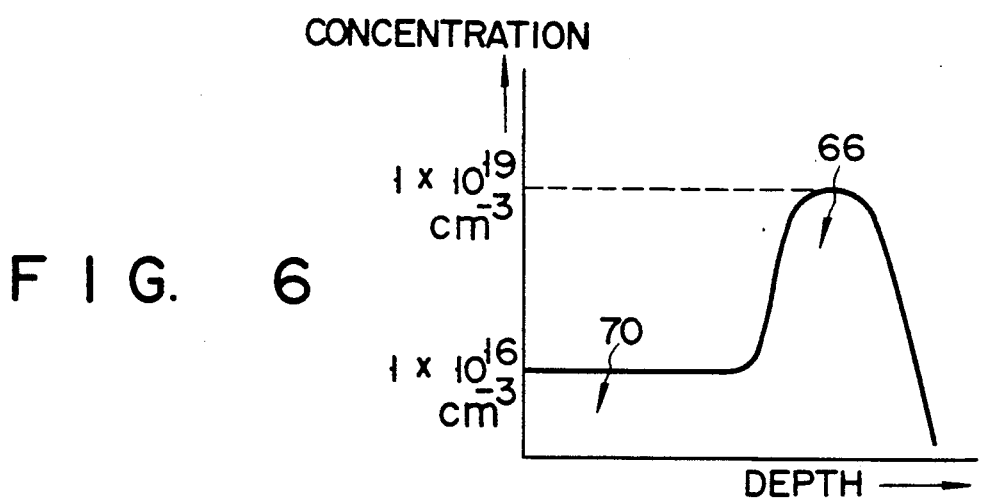
FIG. 6 is a graph illustrating the impurity-concentration profile of that N-type epitaxial layer of the device shown in FIG. 4J, in which another bipolar transistor is formed.

FIG. 6 is a graph illustrating the impurity concentration profile common to the N-type epitaxial layer 70 and the $N^{30}$-type buried layer 66 in which the first bipolar transistor is formed. As is evident from this figure, the layer 66, which is formed deep within the semiconductor device, has a impurity concentration as high as $1 \times 10^{19}$ cm$^{-3}$. In contrast, the N-type epitaxial layer 70 has an impurity concentration of about $1 \times 10^{16}$ cm$^{-3}$ at its surface, but its impurity concentration neither decreases nor increases even in its deepest portion. Its portion contacting the $N^{30}$-type buried layer 66 has the same impurity concentration as its surface portion. As is seen from FIG. 6, the impurity profile of the N-type epitaxial layer 70 does not incline. Hence, when the first bipolar has a current amplification factor $h_{FE}$ of 100, like the first bipolar transistor, its collector-base breakdown voltage $BV_{CBO}$ will be 41V, its emitter-collector breakdown voltage $BV_{CEO}$ will be 13V, its early voltage $V_{AF}$ will be 51V, and its maximum cutoff frequency $f_{TMAX}$ will be 8GHz. Obviously, the collector-base breakdown voltage $BV_{CBO}$, emitter-collector breakdown voltage $BV_{CEO}$, and early voltage $V_{AF}$ of the first bipolar transistor are higher than those of the second bipolar transistor. Hence, the first bipolar transistor has a high breakdown voltage, a great current-amplification factor, and good linear characteristic.

Figure 7:
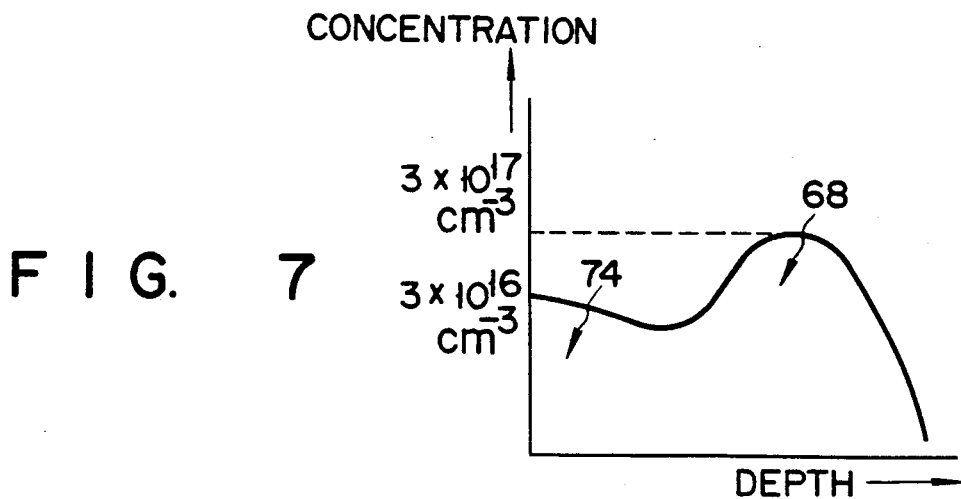
FIG. 7 is a graph representing the impurity-concentration profile of that P-type well-region of the device shown in FIG. 4J, in which an N-channel MOSFET is formed.

FIG. 7 is a graph representing the impurity concentration profile common to the P-type well-regions 74 and the $P^{30}$-type buried layer 68, in which the P-channel MOSFET is formed. As is evident from this figure, the layer 68, which is formed deep within the semiconductor device, has a impurity concentration as high as $3 \times 10^{17}$ cm$^{-3}$. In contrast, the P-type well-region 74 has an impurity concentration of about $3 \times 10^{16}$ cm$^{-3}$ at its surface, but its impurity concentration gradually decreases toward to the bottom.

The P-type well-region 74 has been formed by ion injection and heat-treated a few times, each time at a low temperature for a short time. The impurity has not diffused from the $P^{30}$-type buried layer 68 into the P-type well-region 74 which is located above the buried layer 68. Therefore, the N-channel MOSFET has its characteristic unchanged, and its reliability is high.

Moreover, a portion of the $P^{30}$-type buried layer 68 can maintain a high impurity concentration. Hence, the layer 68 can reliably prevent punch-through between the N-type well-regions 72a and 72b, on the one hand, and the N-type epitaxial layer 70, on the other. Further, the layer 68, which has a high impurity concentration, makes the memory LSI resistant to soft errors which may result from the α-rays penetrating into the memory LSI. In other words, that portion of the buried layer 68 functions as a barrier keeping the electrons resulting from the α-rays, away from the N-type well-regions 72a and 72b. Still further, since the P-type well-region 74 has a high impurity concentration, a part of which functions as an electron barrier, the short-channel effect is suppressed also in the N-type MOSFET.

As has been described, the first and second bipolar transistors of the different types are formed on the same semiconductor substrate. Hence, these transistors can be used in various types of the circuit units in accordance with their characteristics. More specifically, the first bipolar transistor, whose breakdown voltage is high, can be used in a circuit unit to which an external power-supply voltage of 5V is directly applied. On the other hand, the second bipolar transistor, which has good high-frequency characteristic, though its breakdown voltage is low, can be used in a circuit unit which is applied with an internal power-supply voltage of 3V to 3.3V obtained by reducing the external power-supply voltage of 5V. When the bipolar transistors are used in this specific manner, the semiconductor device can meets the demand for a higher integration density. To be precise, the device can fulfill the requirements of reducing an external power-supply voltage into an internal power-supply voltage, which is applied to the internal circuit units.

Furthermore, the first and second bipolar transistors can be used in circuit units to which the external power-supply voltages of different values are directly applied. If this is the case, the higher external power-supply voltage of 5V is applied to the first bipolar transistor, whereas the lower external power-supply voltage ranging from 3V to 3.3V is applied to the second bipolar transistor.

As has been described, the N-type well-region 72b, in which the second bipolar transistor is formed, is formed in the same step as the N-type well-region 72a, in which the P-channel MOSFET is formed, and has thus the same impurity-concentration profile as the N-type well-region 72a. Therefore, the method of manufacturing this semiconductor device has less steps than otherwise.

According to the present invention, the impurity concentration of the N-type epitaxial layer 70, in which the first bipolar transistor is formed, ranges from $5 \times 10^{15}$ cm$^{-3}$ to $2 \times 10^{16}$ cm$^{-3}$ in practice. The impurity concentration of the N-type well-regions 72a and 72b, and that of the P-type well-region 74 ranges from $3 \times 10^{16}$ cm$^{-3}$ to $2 \times 10^{17}$ cm$^{-3}$ in practice. (As as been described, these regions 72a, 72b, and 74 are formed by injecting impurity ions into the N-type epitaxial layer 70, and the P-channel MOSFET and the second bipolar transistor are formed in the regions 72a and 72b, where as the N-channel MOSFET is formed in the region 74.) Either MOSFET has a gate as short as about 0.7 μm or less long.

To make the semiconductor device sufficiently resistant to soft errors so that it can be used in a memory LSI, the impurity concentration of the P$^{30}$-type buried layer 68 is set at $1 \times 10^{16}$ cm$^{-3}$ to $5 \times 10^{17}$ cm$^{-3}$, and the thickness of the N-type epitaxial layer 70 is set at 1.0 μm to 1.8 μm. In addition, the structure is not heat-treated at 1050° C. or more for 10 minutes or longer after the N-type epitaxial layer 70 has been formed. Otherwise, the impurity would diffuse from the P$^{30}$-type buried layer 68 into the well-regions.

As has been described in detail, the present invention can provide a semiconductor device which has a structure best suited reduce an external power-supply voltage into a low internal power-supply voltage in order to attain a high integration density.

Additional advantages and modifications will readily occur to those skilled in the art. Therefore, the invention in its broader aspects is not limited to the specific details, the representative device, and the illustrated example shown and described. Accordingly, departures may be made from such details without departing from the spirit or scope of the general inventive concept as defined by the appended claims and their equivalents.

What is claimed is:

1. A semiconductor device for use in a hybrid LSI circuit, said semiconductor device comprising:
   a semiconductor substrate of a first conductivity type;
   a MOSFET section having a buried layer of a specified conductivity type formed on said semiconductor substrate, a well region of the same conductivity type as the buried layer and which is formed in the buried layer, a current path having first and second terminals, and a control electrode; and
   at least first and second bipolar transistors formed on said semiconductor substrate, each of said at least first and second bipolar transistors having a base, a collector, and an emitter, the collector of said first transistor comprising a buried layer of a second conductivity type and a well region of the second conductivity type formed on said buried layer of the second conductivity type, and the collector of said second transistor comprising said buried layer of the second conductivity type and an epitaxial layer of the second conductivity type formed on said buried layer of the second conductivity type, the collectors of said bipolar transistors having different impurity concentration profiles.

2. A device according to claim 1, wherein the collector of said first bipolar transistor has the same impurity concentration as that of the collector of said semiconductor substrate or that of said epitaxial layer, and the collector of said second bipolar transistor has an impurity concentration higher than that of the collector of said first bipolar transistor, and has an impurity concentration profile identical to that of a region in which said MOSFET section is formed.

3. A device according to claim 1, wherein an external power-supply voltage is applied to said first bipolar transistor, and a voltage obtained by reducing the external power-supply voltage and equal to the voltage applied to said MOSFET section is applied to the second bipolar transistor.

4. A device according to claim 2, wherein an external power-supply voltage is applied to said first bipolar transistor, and a voltage obtained by reducing the external power-supply voltage and equal to the voltage applied to said MOSFET section is applied to the second bipolar transistor.

5. A device according to claim 1, wherein a first external power-supply voltage is applied to said first bipolar transistor, and a second external power-supply voltage lower than the first external power-supply voltage is applied to the second bipolar transistor.

6. A device according to claim 4, wherein the external power-supply voltage applied to said first bipolar transistor is about 5V, and the voltage applied to the second bipolar transistor ranges from 3V to 3.3V.

7. A device according to claim 5, wherein the first external power-supply voltage is about 5V, and the second external power-supply voltage ranges from 3V to 3.3V.

8. A device according to claim 2, wherein a first external power-supply voltage is applied to said first bipolar transistor, and a second external power-supply voltage lower than the first external power-supply voltage is applied to the second bipolar transistor.

9. A device according to claim 8, wherein the first external power-supply voltage is about 5V, and the second external power-supply voltage ranges from 3V to 3.3V.

10. A device according to claim 1, wherein said MOSFET section has a minimum gate length of 0.7 μm.

11. A device according to claim 1, wherein said well-region of the second conductivity type has an impurity concentration of at least $3 \times 10^{16}$ cm$^{-3}$ at a surface portion.

12. A device according to claim 11, wherein said well-region of the second conductivity type has an impurity concentration of at least $3 \times 10^{16}$ cm$^{-3}$ to $2 \times 10^{17}$ cm$^{-3}$ at a surface portion.

13. A device according to claim 1, wherein said epitaxial layer of the second conductivity type has an impurity concentration of at most $2 \times 10^{16}$ cm$^{-3}$.

14. A device according to claim 13, wherein said epitaxial layer of the second conductivity type has an impurity concentration of $5 \times 10^{15}$ cm$^{-3}$ to $2 \times 10^{16}$ cm$^{-3}$.

15. A device according to claim 1, wherein said MOSFET section has at least two MOSFETs, one of which has the first conductivity type, and the other of which has the second conductivity type, the MOSFET of the first conductivity type comprises a buried layer of the first conductivity type formed on said semiconductor substrate and a well-region of the first conductivity type formed on the buried layer of the first conductivity type, and the MOSFET of the second conductivity type comprises a buried layer of the second conductivity type formed on said semiconductor substrate and a well-region of the second conductivity type formed on the buried layer of the second conductivity type.

16. A device according to claim 15, wherein said buried layer of the first conductivity type has an impurity concentration of $1 \times 10^{16}$ cm$^{-3}$ to $5 \times 10^{17}$ cm$^{-3}$.

17. A semiconductor device for use in a hybrid LSI circuit, said semiconductor device comprising:

a semiconductor substrate of a first conductivity type;

at least first and second bipolar transistors formed on said semiconductor substrate, each of said at least first and second bipolar transistors having a base, a collector, and an emitter, the collector of said first transistor comprising a buried layer of a second conductivity type and a well-region of the second conductivity type formed on said buried layer, and the collector of said second transistor comprising said buried layer and an epitaxial layer of the second conductivity type formed on said buried layer, the collectors of said bipolar transistors having different impurity concentration profiles.

18. The semiconductor device according to claim 17 further comprising:

a MOSFET section having a buried layer of a specified conductivity type formed on said semiconductor substrate, a well-region of the same conductivity type as the buried layer of the specified conductivity type and which is formed in the buried layer, a current path having first and second terminals, and a control electrode.

19. The semiconductor device according to claim 17 wherein said well region of the second conductivity type has an impurity concentration of at least $3 \times 10^{16}$ cm$^{-3}$ at a surface portion thereof.

20. The semiconductor device according to claim 17 wherein said well region of the second conductivity type has an impurity concentration of $3 \times 10^{16}$ cm$^{-3}$ to $2 \times 10^{17}$ cm$^{-3}$ at a surface portion thereof.

21. The semiconductor device according to claim 1 wherein said epitaxial layer has an impurity concentration of at most $2 \times 10^{16}$ cm$^{-3}$.

22. The semiconductor device according to claim 1 wherein said epitaxial layer has an impurity concentration of $5 \times 10^{15}$ cm$^{-3}$ to $2 \times 10^{16}$ cm$^{-3}$.

23. A semiconductor device for use in a hybrid LSI circuit, said semiconductor device comprising a semiconductor substrate and at least two bipolar transistors, each of said at least two bipolar transistors comprising a base region of a first conductivity type, an emitter region of a second conductivity type, and a collector region of the second conductivity type formed in said semiconductor substrate, the collector regions of said bipolar transistors having different impurity concentration profiles.

24. The semiconductor device according to claim 23 wherein said bipolar transistors comprise NPN transistors.

* * * * *

UNITED STATES PATENT AND TRADEMARK OFFICE
CERTIFICATE OF CORRECTION

PATENT NO. : 5,014,106

DATED : May 7, 1991

INVENTOR(S) : Takeo MAEDA and Masayoshi HIGASHIZONO

It is certified that error appears in the above-identified patent and that said Letters Patent is hereby corrected as shown below:

In Column 1:

On line 23, change "$N^{30}_{30}$" to --$N^+$--.
On line 24, change "$P^{30}_{30}$" to --$P^+$--.
On line 30, chagne "$N^{30}_{30}$" to --$N^+$--.
On line 34, change "$P^{30}_{30}$" to --$P^+$--.
On line 67, change "$P^{30}$" to --$P^+$--.

IN COLUMN 2:

On line 3, change "$P^{30}_{30}$" to --$P^+$--.
On line 10, change "$N^{30}_{30}$" to --$N^+$--.
On line 11, change "$N^{30}_{30}$" to --$N^+$--.
On line 31, change "$N^{30}$--" to --$N^+$--.

IN COLUMN 3:

On line 14, change "$P^{30}_{30}$" to --$P^+$--.
On line 22, change "$P^{30}_{30}$" to --$P^+$--.
On line 34, change "$P^{30}_{30}$" to --$P^+$--.
On line 52, change "$P^{30}$" to --$P^+$--.

IN COLUMN 5:

On line 4, change "$N^{30}_{30}$" to --$N^+$--.
On line 9, change "$N^{30}_{30}$" (both occurrences) to --$N^+$--.
On line 23, change "$P^{30}$" to --$P^+$--.

IN COLUMN 6:

On line 5, change "$P^{30}_{30}$" to --$P^+$--.
On line 50, change "$N^{30}_{30}$" to --$N^+$--.
On line 52, change "$N^{30}$" to --$N^+$--.

UNITED STATES PATENT AND TRADEMARK OFFICE
CERTIFICATE OF CORRECTION

PATENT NO. : 5,014,106

DATED : May 7, 1991

INVENTOR(S) : Takeo MAEDA and Masayoshi HIGASHIZONO

It is certified that error appears in the above—identified patent and that said Letters Patent is hereby corrected as shown below:

In Column 7:

On line 25, change "$P_{30}^{30}$" to --$P^+$--.
On line 26, change "$P^{30}$" (both occurrences) to --$P^+$--.

In Column 8:

On line 4, change "$N_{30}^{30}$" to --$N^+$--.
On line 5, change "$N^{30}$" to --$N^+$--.
On line 11, change "(not shown)" to --108--.
On line 45, change "$N_{30}^{30}$" to --$N^+$--.
On line 67, change "$P^{30}$" to --$P^+$--.
On line 15, "(not shown)" should read --108--.

In Column 9:

On line 29, change "$N_{30}^{30}$" to --$N^+$--.
On line 39, change "$N_{30}^{30}$" to --$N^+$--.
On line 57, change "$N_{30}^{30}$" to --$N^+$--.
On line 65, change "$N^{30}$" to --$N^+$--.

In Column 10:

On line 15, change "$P_{30}^{30}$" to --$P^+$--.
On line 26, change "$P_{30}^{30}$" to --$P^+$--.
On line 30, change "$P^{30}$" to --$P^+$--.

UNITED STATES PATENT AND TRADEMARK OFFICE
CERTIFICATE OF CORRECTION

PATENT NO. : 5,014,106

DATED : May 7, 1991

INVENTOR(S) : Takeo MAEDA and Masayoshi HIGASHIZONO

It is certified that error appears in the above-identified patent and that said Letters Patent is hereby corrected as shown below:

In Column 11:

On line 28, change "$P^{30}$" to --$P^+$--.
On line 34, change "$P^{30}$" to --$P^+$--.

Signed and Sealed this

Twelfth Day of January, 1993

Attest:

DOUGLAS B. COMER

Attesting Officer

Acting Commissioner of Patents and Trademarks